(12) United States Patent
Rim et al.

(10) Patent No.: US 9,634,177 B2
(45) Date of Patent: Apr. 25, 2017

(54) SOLAR CELL EMITTER REGION FABRICATION WITH DIFFERENTIATED P-TYPE AND N-TYPE REGION ARCHITECTURES

(71) Applicants: Seung Bum Rim, Palo Alto, CA (US); David D. Smith, Campbell, CA (US); Taiqing Qiu, Los Gatos, CA (US); Staffan Westerberg, Sunnyvale, CA (US); Kieran Mark Tracy, San Jose, CA (US); Venkatasubramani Balu, Santa Clara, CA (US)

(72) Inventors: Seung Bum Rim, Palo Alto, CA (US); David D. Smith, Campbell, CA (US); Taiqing Qiu, Los Gatos, CA (US); Staffan Westerberg, Sunnyvale, CA (US); Kieran Mark Tracy, San Jose, CA (US); Venkatasubramani Balu, Santa Clara, CA (US)

(73) Assignee: SunPower Corporation, San Jose, CA (US)

(*) Notice: Subject to any disclaimer, the term of this patent is extended or adjusted under 35 U.S.C. 154(b) by 1 day.

(21) Appl. No.: 14/919,049

(22) Filed: Oct. 21, 2015

(65) Prior Publication Data
US 2016/0043267 A1     Feb. 11, 2016

Related U.S. Application Data

(62) Division of application No. 14/136,751, filed on Dec. 20, 2013, now Pat. No. 9,196,758.

(51) Int. Cl.
*H01L 31/18*     (2006.01)
*H01L 31/0224*   (2006.01)
(Continued)

(52) U.S. Cl.
CPC ...... *H01L 31/182* (2013.01); *H01L 31/02167* (2013.01); *H01L 31/02363* (2013.01);
(Continued)

(58) Field of Classification Search
CPC ..... H01L 31/022441; H01L 31/022458; H01L 31/056; H01L 31/0682
See application file for complete search history.

(56) References Cited

U.S. PATENT DOCUMENTS 9,252,301 B2   2/2016   Morigami et al.
9,257,593 B2   2/2016   Hashiguchi et al.
(Continued)

OTHER PUBLICATIONS

International Search Report and Written Opinion for PCT Patent Application No. PCT/US2014/070163, mailed Mar. 30, 2015, 16 pgs.
(Continued)

*Primary Examiner* — Devina Pillay
*Assistant Examiner* — Daniel Malley, Jr.
(74) *Attorney, Agent, or Firm* — Blakely Sokoloff Taylor Zafman LLP (57) ABSTRACT

Methods of fabricating solar cell emitter regions with differentiated P-type and N-type regions architectures, and resulting solar cells, are described. In an example, a back contact solar cell includes a substrate having a light-receiving surface and a back surface. A first polycrystalline silicon emitter region of a first conductivity type is disposed on a first thin dielectric layer disposed on the back surface of the substrate. A second polycrystalline silicon emitter region of a second, different, conductivity type is disposed on a second thin dielectric layer disposed on the back surface of the substrate. A third thin dielectric layer is disposed laterally directly between the first and second polycrystalline silicon emitter regions. A first conductive contact structure is disposed on the first polycrystalline silicon emitter region. A
(Continued)

second conductive contact structure is disposed on the second polycrystalline silicon emitter region.

11 Claims, 7 Drawing Sheets

(51) Int. Cl.
    *H01L 31/068* (2012.01)
    *H01L 31/20* (2006.01)
    *H01L 31/0236* (2006.01)
    *H01L 31/0368* (2006.01)
    *H01L 31/0216* (2014.01)
    *H01L 31/0745* (2012.01)
    *H01L 31/0747* (2012.01)

(52) U.S. Cl.
    CPC ........ *H01L 31/022441* (2013.01); *H01L 31/03682* (2013.01); *H01L 31/068* (2013.01); *H01L 31/0682* (2013.01); *H01L 31/0745* (2013.01); *H01L 31/0747* (2013.01); *H01L 31/1804* (2013.01); *H01L 31/202* (2013.01); *H01L 31/208* (2013.01); *Y02E 10/547* (2013.01); *Y02P 70/521* (2015.11)

(56) References Cited

U.S. PATENT DOCUMENTS

| | | |
|---|---|---|
| 2005/0062041 A1 | 3/2005 | Terakawa et al. |
| 2009/0308438 A1 | 12/2009 | De Ceuster et al. |
| 2010/0051085 A1 | 3/2010 | Weidman et al. |
| 2010/0154876 A1 | 6/2010 | Camalleri et al. |
| 2011/0041911 A1 | 2/2011 | Lee et al. |
| 2012/0211063 A1 | 8/2012 | Lee et al. |
| 2012/0222735 A1 | 9/2012 | Xu |
| 2012/0266951 A1 | 10/2012 | Li et al. |
| 2013/0164878 A1 | 6/2013 | Cousins et al. |
| 2014/0318611 A1 | 10/2014 | Moslehi et al. |

OTHER PUBLICATIONS

First Action Interview Pilot Program Pre-Interview Communication from U.S. Appl. No. 14/136,751 mailed May 8, 2015, 4 pgs.

International Preliminary Report on Patentability for PCT Patent Application No. PCT/US2014/070163, mailed Jun. 30, 2016, 12 pgs.

SOLAR CELL EMITTER REGION FABRICATION WITH DIFFERENTIATED P-TYPE AND N-TYPE REGION ARCHITECTURES

CROSS-REFERENCE TO RELATED APPLICATIONS

This application is a divisional of U.S. patent application Ser. No. 14/136,751, filed on Dec. 20, 2013, the entire contents of which are hereby incorporated by reference herein.

TECHNICAL FIELD

Embodiments of the present disclosure are in the field of renewable energy and, in particular, methods of fabricating solar cell emitter regions with differentiated P-type and N-type regions architectures, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions with differentiated P-type and N-type regions architectures, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a back contact solar cell includes a substrate having a light-receiving surface and a back surface. A first polycrystalline silicon emitter region of a first conductivity type is disposed on a first thin dielectric layer disposed on the back surface of the substrate. A second polycrystalline silicon emitter region of a second, different, conductivity type is disposed on a second thin dielectric layer disposed on the back surface of the substrate. A third thin dielectric layer is disposed laterally directly between the first and second polycrystalline silicon emitter regions. A first conductive contact structure is disposed on the first polycrystalline silicon emitter region. A second conductive contact structure is disposed on the second polycrystalline silicon emitter region.

Also disclosed herein are methods of fabricating solar cells. In one embodiment, a method of fabricating alternating N-type and P-type emitter regions of a solar cell involves forming a first silicon layer of a first conductivity type on a first thin dielectric layer formed on a back surface of a substrate. An insulating layer is formed on the first silicon layer. The insulating layer and the first silicon layer are patterned to form first silicon regions of the first conductivity type having an insulating cap thereon. A second thin dielectric layer is formed on exposed sides of the first silicon regions. A second silicon layer of a second, different, conductivity type is formed on a third thin dielectric layer formed on the back surface of the substrate, and on the second thin dielectric layer and the insulating cap of the first silicon regions. The second silicon layer is patterned to form isolated second silicon regions of the second conductivity type and to form contact openings in regions of the second silicon layer above the insulating cap of the first silicon regions. The insulating cap is patterned through the contact openings to expose portions of the first silicon regions. A mask is formed to expose only the exposed portions of the first silicon regions and the isolated second silicon regions. A metal seed layer is formed on the exposed portions of the first silicon regions and on the isolated second silicon regions. A metal layer is plated on the metal seed layer to form conductive contacts for the first silicon regions and the isolated second silicon regions.

In another embodiment, a method of fabricating alternating N-type and P-type emitter regions of a solar cell involves forming a first silicon layer of a first conductivity type on a first thin dielectric layer formed on a back surface of a substrate. An insulating layer is formed on the first silicon layer. The insulating layer and the first silicon layer are patterned to form first silicon regions of the first conductivity type having an insulating cap thereon. A second thin dielectric layer is formed on exposed sides of the first silicon regions. A second silicon layer of a second, different, conductivity type is formed on a third thin dielectric layer formed on the back surface of the substrate, and on the second thin dielectric layer and the insulating cap of the first silicon regions. The second silicon layer is patterned to form isolated second silicon regions of the second conductivity type and to form contact openings in regions of the second silicon layer above the insulating cap of the first silicon regions. The insulating cap is patterned through the contact openings to expose portions of the first silicon regions. Subsequent to patterning the second silicon layer and the insulating cap, a metal silicide layer is formed from the second silicon layer and from the exposed portions of the first silicon regions. A metal layer is plated on the metal silicide layer to form conductive contacts for the first silicon regions and the isolated second silicon regions.

In a first aspect, one or more embodiments described herein are directed to forming P+ and N+ polysilicon emitter regions for a solar cell where the respective structures of the P+ and N+ polysilicon emitter regions are different from one another. Such an approach can be implemented to simplify a solar cell fabrication process. Furthermore, the resulting structure may provide a lower breakdown voltage and lower power losses associated as compared with other solar cell architectures.

In a second aspect, one or more embodiments described herein are directed to silicide formation for solar cell fabrication. The silicide material can be incorporated into a final solar cell structure, such as a back contact or front contact solar cell structure. Using a silicide material for metallization of a polysilicon emitter region of a solar cell can provide a simpler metallization process for such solar cells. For example, as described in greater detail below, a silicide technique is used to effectively remove a masking operation from a metal seed layer process for contact formation. Furthermore, alignment issues can be reduced since the silicide process is a self-aligned process.

Figure 1:
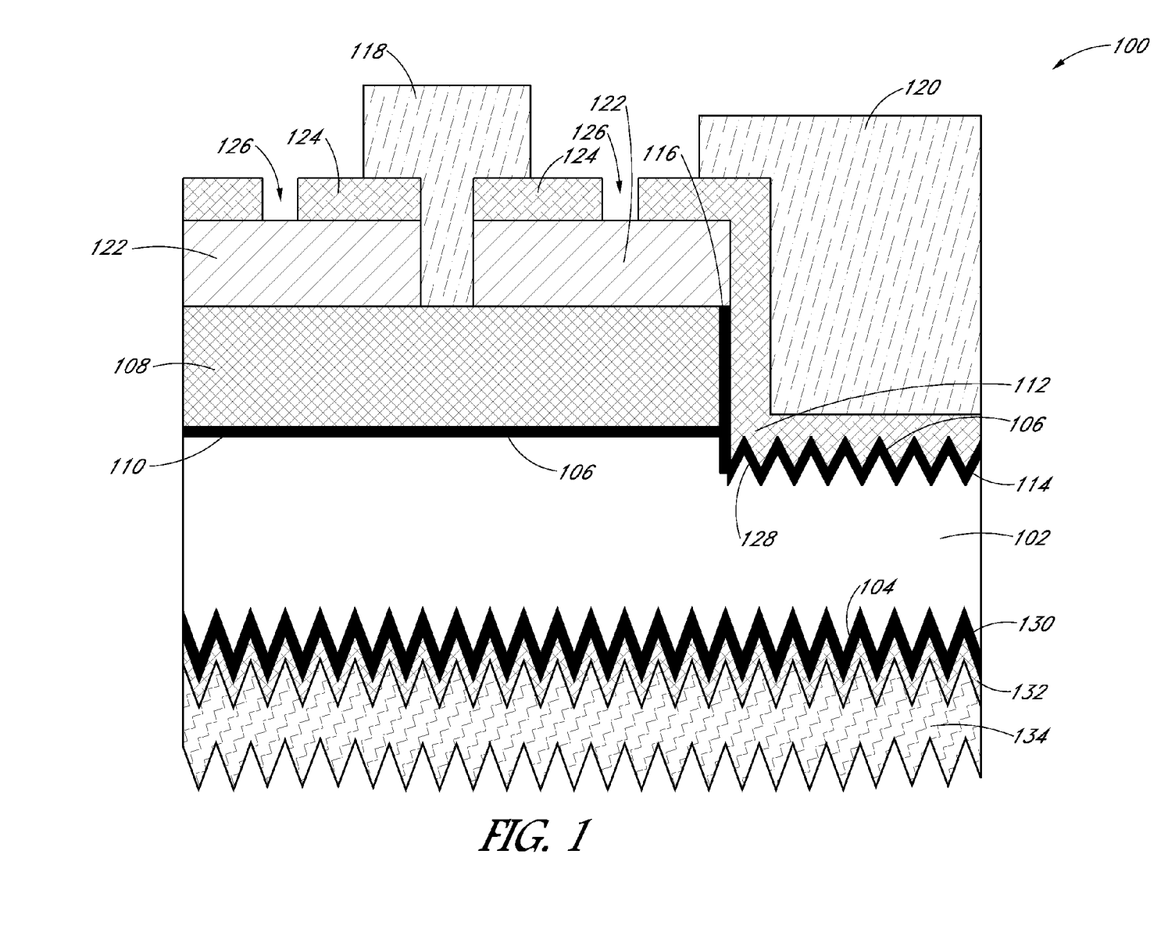
FIG. 1 illustrates a cross-sectional view of a portion of a back contact solar cell, in accordance with an embodiment of the present disclosure.

In a first example, FIG. 1 illustrates a cross-sectional view of a portion of a back contact solar cell 100, in accordance with an embodiment of the present disclosure. The solar cell 100 includes a substrate 102 having a light-receiving surface 104 and a back surface 106. A first polycrystalline silicon emitter region 108 of a first conductivity type is disposed on a first thin dielectric layer 110 disposed on the back surface 106 of the substrate 102. A second polycrystalline silicon emitter region 112 of a second, different, conductivity type is disposed on a second thin dielectric layer 114 disposed on the back surface 106 of the substrate 102. A third thin dielectric layer 116 is disposed laterally directly between the first 108 and second 112 polycrystalline silicon emitter regions. A first conductive contact structure 118 is disposed on the first polycrystalline silicon emitter region 108. A second conductive contact structure 120 is disposed on the second polycrystalline silicon emitter region 112.

Referring again to FIG. 1, in an embodiment, the solar cell 100 further includes an insulator layer 122 disposed on the first polycrystalline silicon emitter region 108. The first conductive contact structure 118 is disposed through the insulator layer 122. Additionally, a portion of the second polycrystalline silicon emitter region 112 overlaps the insulator layer 122 but is separate from the first conductive contact structure 118. In an embodiment, an additional polycrystalline silicon layer 124 of the second conductivity type is disposed on the insulator layer 122, and the first conductive contact structure 118 is disposed through the polycrystalline silicon layer 124 of the second conductivity type and through the insulator layer 122, as is depicted in FIG. 1. As described in greater detail below, in one such embodiment, the additional polycrystalline silicon layer 124 and the second polycrystalline silicon emitter region 112 are formed from a same layer that is blanket deposited and then scribed to provide scribe lines 126 therein.

Referring again to FIG. 1, in an embodiment, the solar cell 100 further includes a recess 128 disposed in the back surface 106 of the substrate 102. The second polycrystalline silicon emitter region 112 and the second thin dielectric layer 114 are disposed in the recess 128. In one such embodiment, the recess 128 has a texturized surface, and the second polycrystalline silicon emitter region 112 and the second thin dielectric layer 114 are conformal with the texturized surface, as is depicted in FIG. 1. In an embodiment, then, the first polycrystalline silicon emitter region 108 and the first thin dielectric layer 110 are disposed on a flat portion of the back surface 106 of the substrate 102, and the second polycrystalline silicon emitter region 112 and the second thin dielectric layer 114 are disposed on a texturized portion of the back surface 106 of the substrate, as is depicted in FIG. 1. It is to be appreciated, however, that other embodiments may not include a texturized surface, or may not include a recess altogether.

Referring again to FIG. 1, in an embodiment, the solar cell 100 further includes a fourth thin dielectric layer 130 disposed on the light-receiving surface 104 of the substrate 102. A polycrystalline silicon layer 132 of the second conductivity type is disposed on the fourth thin dielectric layer 132. An anti-reflective coating (ARC) layer 134, such as a layer of silicon nitride, is disposed on the polycrystalline silicon layer 132. In one such embodiment, as described in greater detail below, the fourth thin dielectric layer 132 is formed by essentially the same process used to form the second thin dielectric layer 114, and the polycrystalline silicon layer 132 is formed by essentially the same process used to form the second polycrystalline silicon emitter region 112.

In an embodiment, the first polycrystalline silicon emitter region 108 is a P-type polycrystalline silicon emitter region. The second polycrystalline silicon emitter region 112 is an N-type polycrystalline silicon emitter region. The substrate is an N-type monocrystalline silicon substrate. In an embodiment, the first thin dielectric layer 110, the second thin dielectric layer 114 and the third thin dielectric layer 116 include silicon dioxide. However, in another embodiment, the first thin dielectric layer 110 and the second thin dielectric layer 114 include silicon dioxide, while the third thin dielectric layer 116 includes silicon nitride. In an embodiment, insulator layer 122 includes silicon dioxide.

In an embodiment, the first conductive contact structure 118 and the second conductive contact structure 120 each include an aluminum-based metal seed layer disposed on the first 108 and second 112 polycrystalline silicon emitter regions, respectively. In one embodiment, each of the first conductive contact structure 118 and the second conductive contact structure 120 further includes a metal layer, such as a copper layer, disposed on the aluminum-based metal seed layer.

Figure 2:
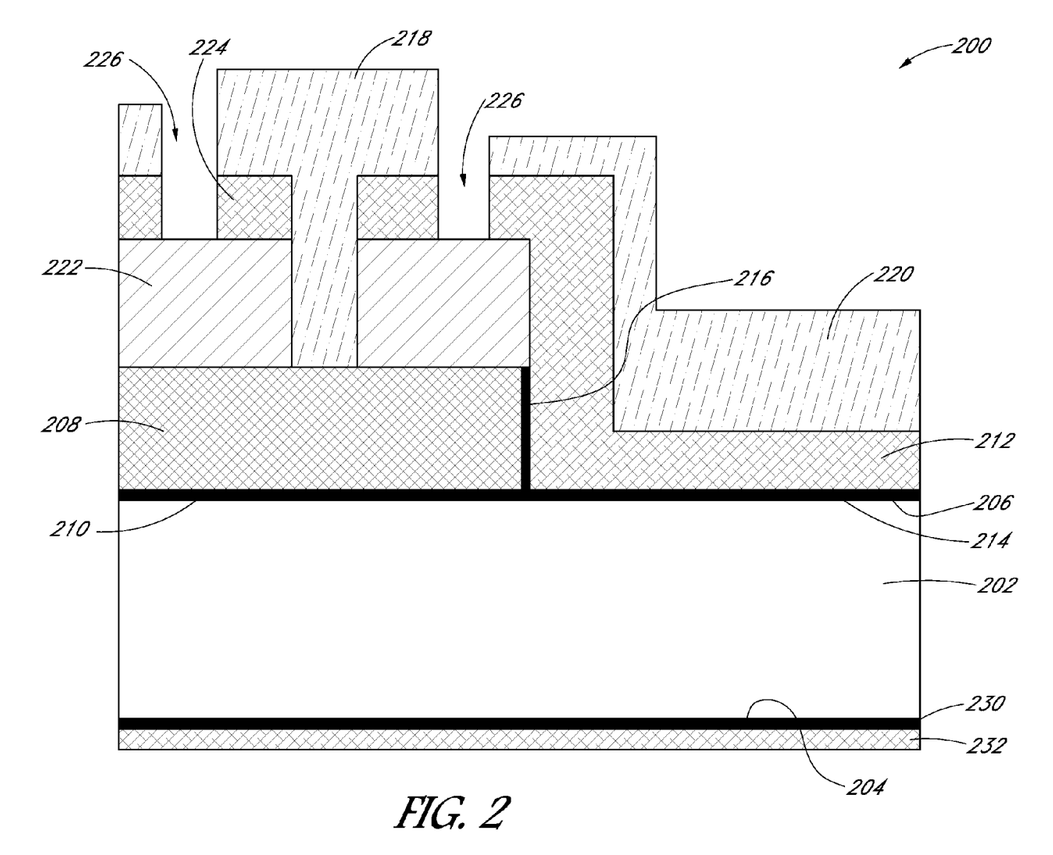
FIG. 2 illustrates a cross-sectional view of a portion of a back contact solar cell, in accordance with another embodiment of the present disclosure.

In a second example, FIG. 2 illustrates a cross-sectional view of a portion of a back contact solar cell 200, in accordance with another embodiment of the present disclosure. The solar cell 200 includes a substrate 202 having a light-receiving surface 204 and a back surface 206. A first polycrystalline silicon emitter region 208 of a first conductivity type is disposed on a first thin dielectric layer 210 disposed on the back surface 206 of the substrate 202. A second polycrystalline silicon emitter region 212 of a second, different, conductivity type is disposed on a second thin dielectric layer 214 disposed on the back surface 206 of the substrate 202. A third thin dielectric layer 216 is disposed laterally directly between the first 208 and second 212 polycrystalline silicon emitter regions. A first conductive contact structure 218 is disposed on the first polycrystalline silicon emitter region 208. A second conductive contact structure 220 is disposed on the second polycrystalline silicon emitter region 212.

In accordance with an embodiment of the present disclosure, the first 218 and second 220 conductive contact structures each include a metal silicide layer disposed on the first 208 and second 212 polycrystalline silicon emitter regions, respectively. In one such embodiment, the metal silicide layer is formed by consuming exposed regions of the first 208 and second 212 polycrystalline silicon emitter regions in a silicidation process. As such, all exposed top surfaces of the first 208 and second 212 polycrystalline silicon emitter regions, and any other exposed silicon surfaces, are metalized, as is depicted in FIG. 2. In an embodiment, the first 218 and second 220 conductive contact structures each further includes a metal layer (such as copper) disposed on the metal silicide layer. In a particular embodiment, the metal silicide layer includes a material such as, but not limited to, titanium silicide ($TiSi_2$), cobalt silicide ($CoSi_2$), tungsten silicide ($WSi_2$), or nickel silicide ($NiSi$ or $NiSi_2$).

Referring again to FIG. 2, in an embodiment, the solar cell 200 further includes an insulator layer 222 disposed on the first polycrystalline silicon emitter region 208. The first conductive contact structure 218 is disposed through the insulator layer 222. Additionally, a portion of the second polycrystalline silicon emitter region 212 overlaps the insulator layer 222 but is separate from the first conductive contact structure 218. In an embodiment, an additional polycrystalline silicon layer 224 of the second conductivity type is disposed on the insulator layer 222, and the first conductive contact structure 218 is disposed through the polycrystalline silicon layer 224 of the second conductivity type and through the insulator layer 222, as is depicted in FIG. 2. However, in contrast to FIG. 1, the entire top surface of the polycrystalline silicon layer 224 is metalized. As described in greater detail below, in one such embodiment, the additional polycrystalline silicon layer 224 and the second polycrystalline silicon emitter region 212 are formed from a same layer that is blanket deposited and then scribed to provide scribe lines 226 therein.

Referring again to FIG. 2, in an embodiment, the back surface 206 of the substrate 202 is essentially entirely flat. However, in another embodiment, the second polycrystalline silicon emitter region 212 and the second thin dielectric layer 214 are disposed in a recess, as was described in association with FIG. 1. In one such embodiment, the recess has a texturized surface, and the second polycrystalline silicon emitter region 212 and the second thin dielectric layer 214 are conformal with the texturized surface.

Referring again to FIG. 2, in an embodiment, the solar cell 200 further includes a fourth thin dielectric layer 230 disposed on the light-receiving surface 204 of the substrate 202. A polycrystalline silicon layer 232 of the second conductivity type is disposed on the fourth thin dielectric layer 232. Although not depicted, in an embodiment, an anti-reflective coating (ARC) layer, such as a layer of silicon nitride, is disposed on the polycrystalline silicon layer 232. In one such embodiment, as described in greater detail below, the fourth thin dielectric layer 232 is formed by essentially the same process used to form the second thin dielectric layer 214, and the polycrystalline silicon layer 232 is formed by essentially the same process used to form the second polycrystalline silicon emitter region 212.

In an embodiment, the substrate 202, the first polycrystalline silicon emitter region 208, the second polycrystalline silicon emitter region 212 and the various dielectric layers are as described above for the substrate 102, the first polycrystalline silicon emitter region 108, the second polycrystalline silicon emitter region 112 and the various dielectric layers in association with FIG. 1.

Figure 3:
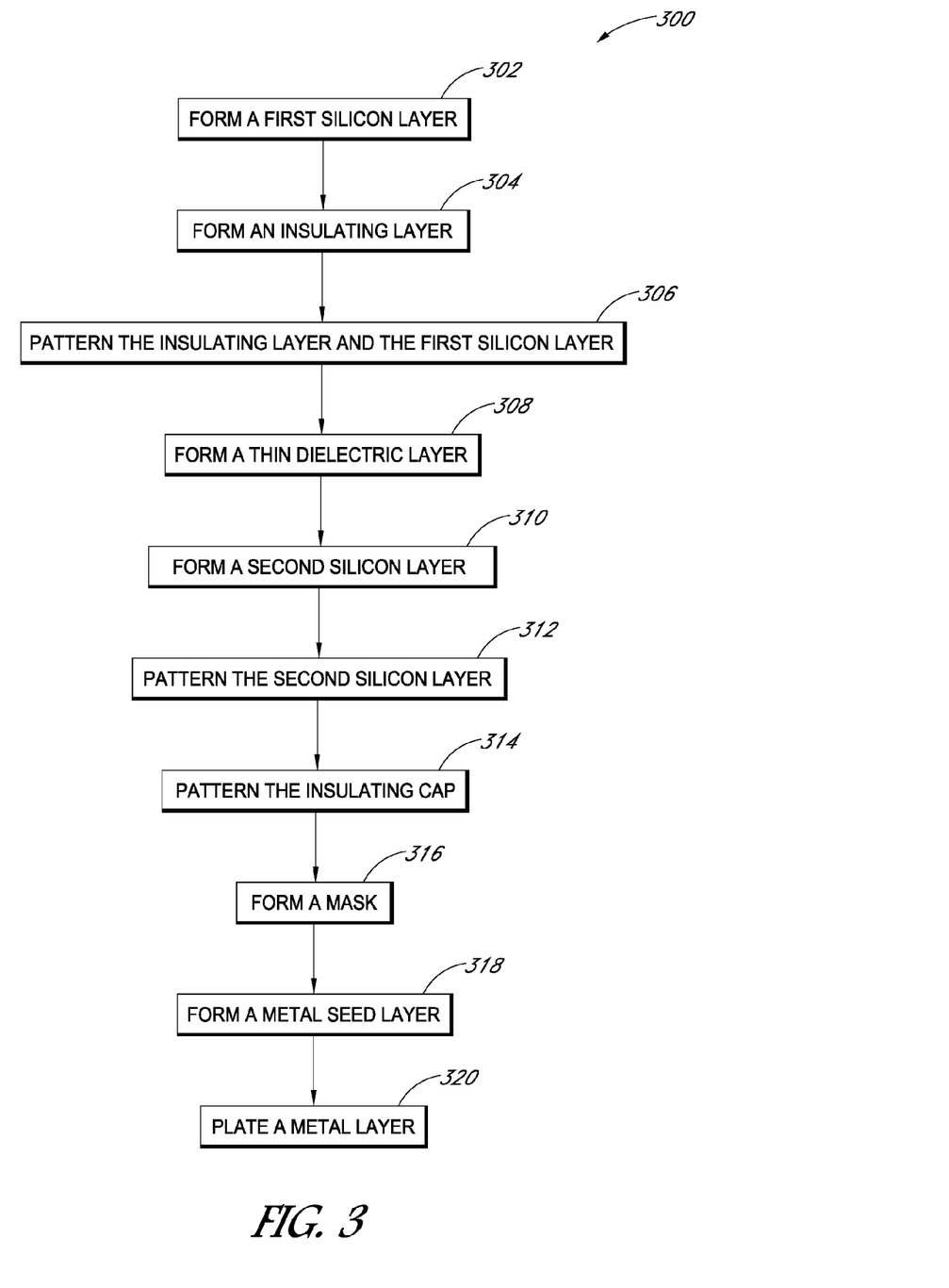
FIG. 3 is a flowchart listing operations in a method of fabricating a solar cell as corresponding to FIGS. 5A-5F, in accordance with an embodiment of the present disclosure.

Also disclosed herein are methods of fabricating solar cells. In a first exemplary process flow, FIGS. 5A-5F illustrate cross-sectional views of various stages in the fabrication of a solar cell, in accordance with an embodiment of the present disclosure. FIG. 3 is a flowchart 300 listing operations in a method of fabricating a solar cell as corresponding to FIGS. 5A-5F, in accordance with an embodiment of the present disclosure.

Figure 5A:
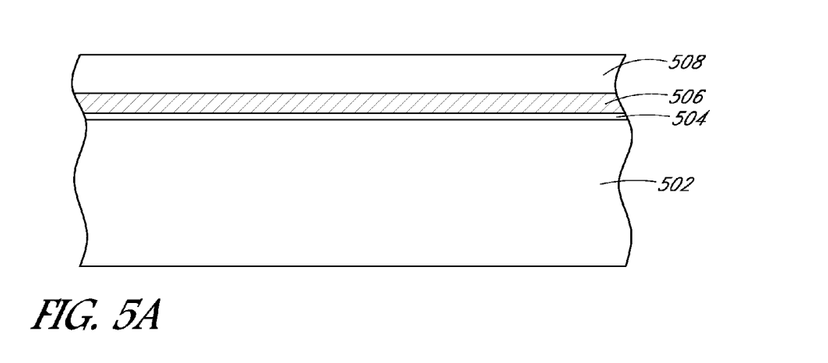
FIGS. 5A-5F illustrate cross-sectional views of various stages in the fabrication of a solar cell, in accordance with an embodiment of the present disclosure.

Referring to FIG. 5A and corresponding operation 302 of flowchart 300, a method of fabricating alternating N-type and P-type emitter regions of a solar cell involves forming a first silicon layer 506 of a first conductivity type on a first thin dielectric layer 504 formed on a back surface of a substrate 502.

In an embodiment, the substrate 502 is a monocrystalline silicon substrate, such as a bulk single crystalline N-type doped silicon substrate. It is to be understood, however, that substrate 502 may be a layer, such as a multi-crystalline silicon layer, disposed on a global solar cell substrate. In an embodiment, the first thin dielectric layer 504 is a thin oxide layer such as a tunnel dielectric silicon oxide layer having a thickness of approximately 2 nanometers or less.

In an embodiment, the first silicon layer 506 is a polycrystalline silicon layer that is doped to have the first conductivity type either through in situ doping, post deposition implanting, or a combination thereof. In another embodiment the first silicon layer 506 is an amorphous silicon layer such as a hydrogenated silicon layer represented by a-Si:H which is implanted with dopants of the first conductivity type subsequent to deposition of the amorphous silicon layer. In one such embodiment, the first silicon layer 506 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the first conductivity type is P-type (e.g., formed using boron impurity atoms).

Referring again to FIG. 5A and now to corresponding operation 304 of flowchart 300, an insulating layer 508 is formed on the first silicon layer 506. In an embodiment the insulating layer 508 includes silicon dioxide.

Figure 5B:
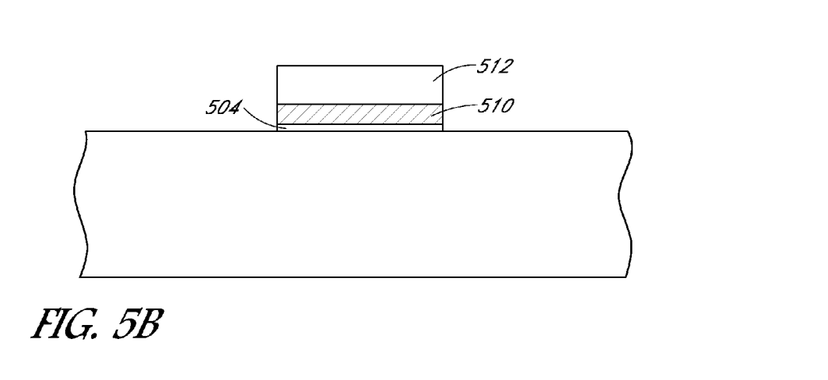

Referring to FIG. 5B and corresponding operation 306 of flowchart 300, the insulating layer 508 and the first silicon layer 506 are patterned to form a first silicon region 510 of the first conductivity type having an insulating cap 512 thereon. In an embodiment, a lithographic or screen print masking and subsequent etch process is used to pattern the insulating layer 508 and the first silicon layer 506. In another embodiment, a laser ablation process (e.g., direct write) is used to pattern the insulating layer 508 and the first silicon layer 506. In either case, in one embodiment, the first thin dielectric layer 504 is also patterned in the process, as is depicted in FIG. 5B.

Figure 5C:
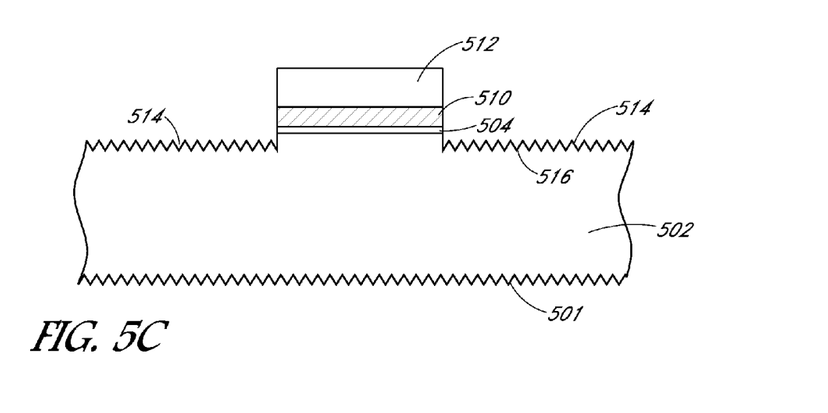

Referring to FIG. 5C, optionally, recesses 514 may be formed in the substrate 502 during (or subsequent to) the patterning of the insulating layer 508 and the first silicon layer 506. Furthermore, in one embodiment, the surfaces 516 of the recesses 514 are texturized. In a same or similar process, a light receiving surface 501 of the substrate 502 may also be texturized, as is depicted in FIG. 5C. In an embodiment, a hydroxide-based wet etchant is used to form at least a portion of the recesses 514 and/or to texturize exposed portions of the substrate 502. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow.

Figure 5D:
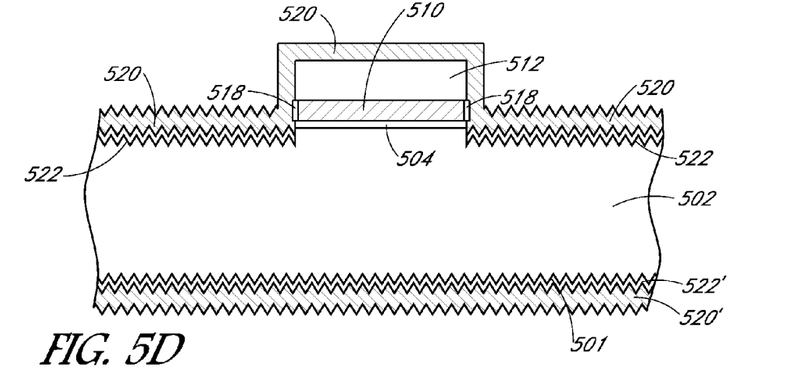

Referring to FIG. 5D and corresponding operation 308 of flowchart 300, a second thin dielectric layer 518 is formed on exposed sides of the first silicon regions 510. In an embodiment, the second thin dielectric layer 518 is formed in an oxidation process and is a thin oxide layer such as a tunnel dielectric silicon oxide layer having a thickness of approximately 2 nanometers or less. In another embodiment, the second thin dielectric layer 518 is formed in a deposition process and is a thin silicon nitride layer or silicon oxynitride layer.

Referring again to FIG. 5D and now to corresponding operation 310 of flowchart 300, a second silicon layer 520 of a second, different, conductivity type is formed on a third thin dielectric layer 522 formed on the back surface of the substrate 502, and on the second thin dielectric layer 518 and the insulating cap 512 of the first silicon regions 510. Corresponding thin dielectric layer 522' and second silicon layer 520' of the second conductivity type may also be formed on the light-receiving surface 501 of the substrate 502, is same or similar process operations, as is depicted in FIG. 5D. Additionally, although not depicted, an ARC layer may be formed on the corresponding second silicon layer 520', as was described in association with FIG. 1.

In an embodiment, the third thin dielectric layer 522 is formed in an oxidation process and is a thin oxide layer such as a tunnel dielectric silicon oxide layer having a thickness of approximately 2 nanometers or less. In an embodiment, the second silicon layer 520 is a polycrystalline silicon layer that is doped to have the second conductivity type either through in situ doping, post deposition implanting, or a combination thereof. In another embodiment the second silicon layer 520 is an amorphous silicon layer such as a hydrogenated silicon layer represented by a-Si:H which is implanted with dopants of the second conductivity type subsequent to deposition of the amorphous silicon layer. In one such embodiment, the second silicon layer 520 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the second conductivity type is N-type (e.g., formed using phosphorus atoms or arsenic impurity atoms).

Figure 5E:
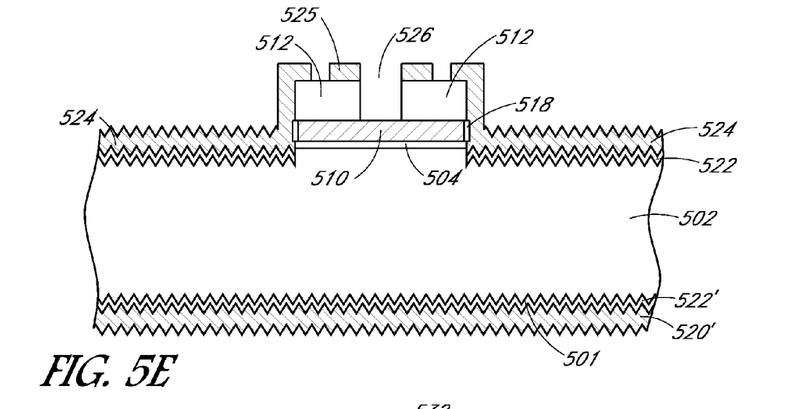

Referring to FIG. 5E and corresponding operation 312 of flowchart 300, the second silicon layer 520 is patterned to form isolated second silicon regions 524 of the second conductivity type and to form a contact opening 526 in regions of the second silicon layer 520 above the insulating cap 512 of the first silicon regions 510. In an embodiment, discrete regions of silicon 525 may remain as an artifact of the patterning process. In an embodiment, a laser ablation process is used to pattern the second silicon layer 520.

Referring again to FIG. 5E and now to corresponding operation 314 of flowchart 300, the insulating cap 512 is patterned through the contact openings 526 to expose portions of the first silicon regions 510. In an embodiment, the insulating cap 512 is patterned using a laser ablation process. For example, in one embodiment, a first laser pass is used to used to pattern the second silicon layer 520, including forming contact opening 526. A second laser pass in the same location as contact opening 526 is the used to pattern the insulating cap 512.

Figure 5F:
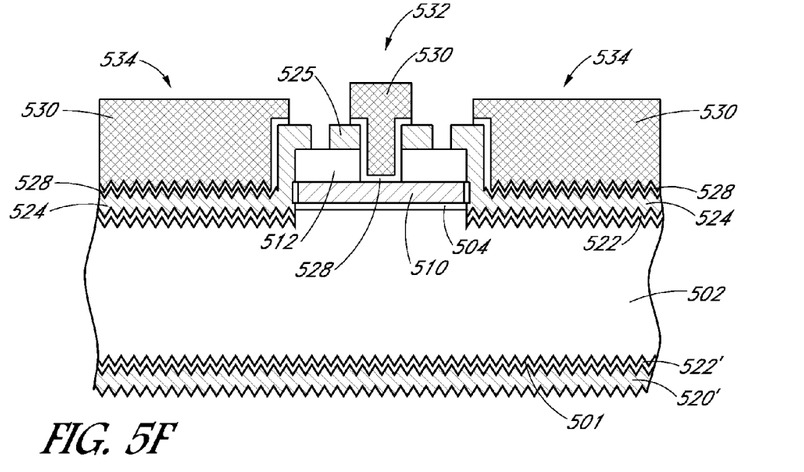

Referring to FIG. 5F, a metal seed layer 528 is formed on the exposed portions of the first silicon regions 510 and on the isolated second silicon regions 524. A metal layer 530 is plated on the metal seed layer to form conductive contacts 532 and 534, respectively, for the first silicon regions 510 and the isolated second silicon regions 524. In an embodiment, the metal seed layer 528 is an aluminum-based metal seed layer, and the metal layer 530 is a copper layer. In an embodiment, a mask is first formed to expose only the exposed portions of the first silicon regions 510 and the isolated second silicon regions 524 in order to direct the metal seed layer 528 formation to restricted locations.

Figure 4:
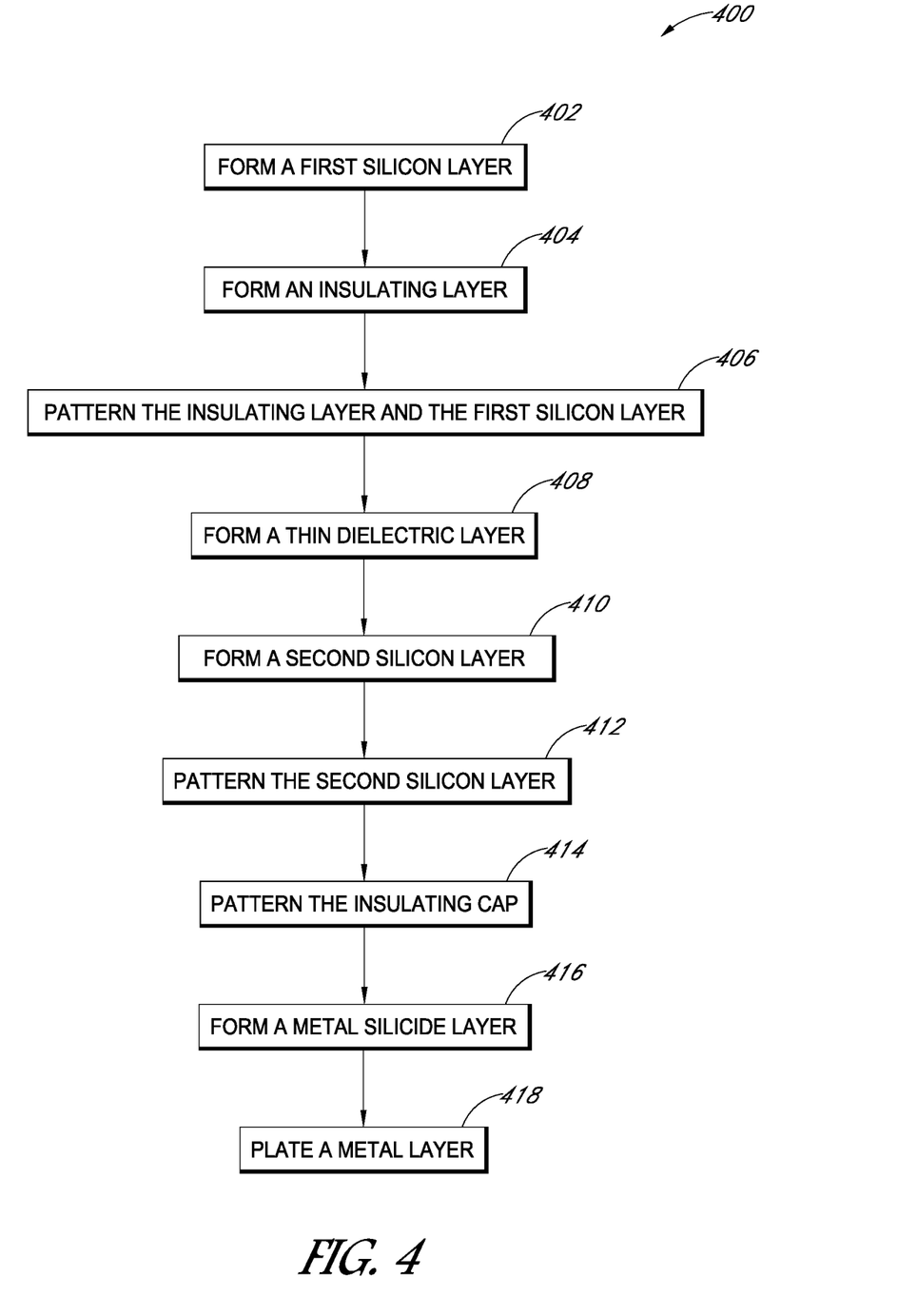
FIG. 4 is a flowchart listing operations in a method of fabricating a solar cell as corresponding to FIGS. 5A-5E and 6A-6B, in accordance with an embodiment of the present disclosure.
Figure 6A:
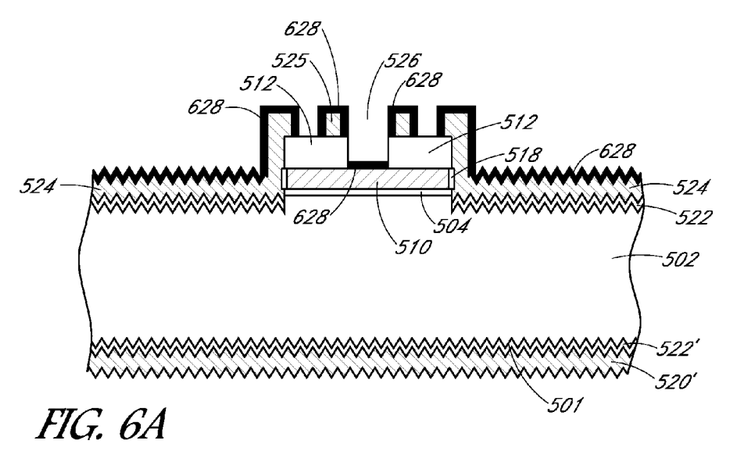
FIGS. 6A-6B illustrate cross-sectional views of various stages in the fabrication of a solar cell, in accordance with another embodiment of the present disclosure.
Figure 6B:
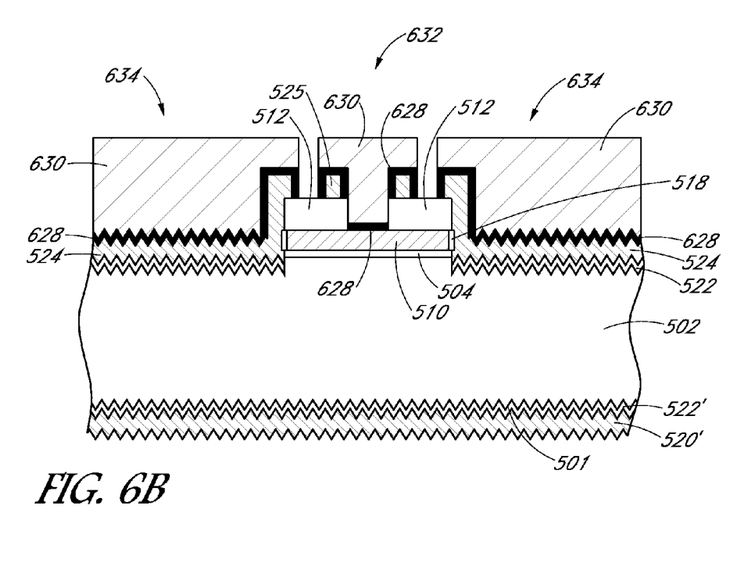

In a second exemplary process flow, FIGS. 6A-6B illustrate cross-sectional views of various stages in the fabrication of another solar cell, in accordance with another embodiment of the present disclosure. FIG. 4 is a flowchart 400 listing operations in a method of fabricating a solar cell as corresponding to FIGS. 5A-5E and 6A-6B, in accordance with an embodiment of the present disclosure. Accordingly, the second exemplary process flow moves from the structure of FIG. 5E to the structure of FIG. 6A.

Referring to FIG. 6A, subsequent to patterning the second silicon layer 520 and the insulating cap 512 (as described in association with FIG. 5E), a metal silicide layer 628 is formed from exposed surfaces of the patterned second silicon layer and from the exposed portions of the first silicon regions 510. In an embodiment, the metal silicide layer is formed by forming a blanket metal layer over the entire structure of FIG. 5E, heating the blanket metal layer to react with exposed silicon and form a metal silicide. Unreacted portions of the blanket metal layer are then removed, e.g., using a wet chemical clean process that is selective to the formed silicide material. In one embodiment, the metal silicide layer 628 includes a material such as, but not limited to, titanium silicide ($TiSi_2$), cobalt silicide ($CoSi_2$), tungsten silicide ($WSi_2$), or nickel silicide (NiSi or $NiSi_2$). In an embodiment, a rapid thermal processing (RTP) anneal is used to form the silicide. In that embodiment, dopants in the silicon layers of the emitter region are activated in the same RTP process. In one embodiment, the RTP process is performed in an oxygen-free or low oxygen environment to reduce oxidation of the silicide metal. However, in another embodiment, a silicide process temperature is lower than the temperature of a separate anneal used for dopant activation.

Referring to FIG. 6B, a metal layer 630 is the plated on the metal silicide layer to form conductive contacts 632 and 634, respectively, for the first silicon regions 510 and the isolated second silicon regions 524. In one embodiment, the metal layer 630 is a copper layer. In one embodiment, the metal silicide layer is chemically activated prior to plating a metal thereon. In another embodiment, instead of plating a metal, an aluminum (Al) foil welding process is used to complete the contact formation.

It is to be appreciated that the silicidation process for contact formation described in association with FIGS. 6A and 6B, as contrasted to the contact formation described in association with FIG. 5F, uses one less mask. In particular, a seed layer does not need to be directed by a mask in the silicidation process since silicide will form only on regions of exposed silicon, which have already been patterned. As such, in an embodiment, the silicidation process is a self-aligned process which can be implemented to mitigate alignment issues and, possibly, reduce the pitch achievable for cell contact fabrication.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. Furthermore, it is to be understood that, where N+ and P+ type doping is described specifically, other embodiments contemplated include the opposite conductivity type, e.g., P+ and N+ type doping, respectively. Furthermore, it is to be appreciated that a silicidation approach that can be used in place of an aluminum seed layer for contact formation may also be applicable to front contact solar cells.

Furthermore, in an embodiment, a cluster plasma enhanced chemical vapor deposition (PECVD) tool can be used to combine many of the above described process operations in a single pass in a process tool. For example, in one such embodiment, up to four distinct PECVD operations and an RTP operation can be performed in a single pass in a cluster tool. The PECVD operations can includes depositions of layers such as the above described back side P+ polysilicon layer, both front and back side N+ polysilicon layers, and the ARC layer.

Thus, methods of fabricating solar cell emitter regions with differentiated P-type and N-type regions architectures, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:
1. A method of fabricating a back contact solar cell, the method comprising:
 providing a substrate having a light-receiving surface and a back surface;

forming a first thin dielectric layer on the back surface of the substrate;

forming a first polycrystalline silicon emitter region of a first conductivity type on the first thin dielectric layer;

forming a recess in the back surface of the substrate;

forming a second thin dielectric layer in the recess;

forming a second polycrystalline silicon emitter region of a second, different, conductivity type on the second thin dielectric layer in the recess;

forming a third thin dielectric layer laterally directly between the first and second polycrystalline silicon emitter regions;

forming a first conductive contact structure on the first polycrystalline silicon emitter region; and forming a second conductive contact structure on the second polycrystalline silicon emitter region, wherein the first polycrystalline silicon emitter region overlaps the second polycrystalline silicon emitter region.

2. The method of claim 1, further comprising:

forming an insulator layer on the first polycrystalline silicon emitter region, wherein the first conductive contact structure is disposed through the insulator layer, and wherein a portion of the second polycrystalline silicon emitter region overlaps the insulator layer but is separate from the first conductive contact structure.

3. The method of claim 1, further comprising:

forming an insulator layer on the first polycrystalline silicon emitter region; and forming the polycrystalline silicon layer of the second conductivity type on the insulator layer, wherein the first conductive contact structure is disposed through the polycrystalline silicon layer of the second conductivity type and through the insulator layer.

4. The method of claim 1, wherein forming the recess comprises forming a recess having a texturized surface.

5. The method of claim 1, wherein forming the first polycrystalline silicon emitter region and forming the first thin dielectric layer comprises forming on a flat portion of the back surface of the substrate, and wherein forming the second polycrystalline silicon emitter region and the second thin dielectric layer comprises forming on a texturized portion of the back surface of the substrate.

6. The method of claim 1, wherein forming the first and second conductive contact structures comprises forming an aluminum-based metal seed layer on the first and second polycrystalline silicon emitter regions, respectively, and forming a metal layer on the aluminum-based metal seed layer.

7. The method of claim 1, wherein forming the first and second conductive contact structures comprises forming a metal silicide layer on the first and second polycrystalline silicon emitter regions, respectively, and forming a metal layer on the metal silicide layer.

8. The method of claim 7, wherein forming the metal silicide layer comprises forming a material selected from the group consisting of titanium silicide ($TiSi_2$), cobalt silicide ($CoSi_2$), tungsten silicide ($WSi_2$), and nickel silicide ($NiSi$ or $NiSi_2$).

9. The method of claim 1, further comprising:

forming a fourth thin dielectric layer on the light-receiving surface of the substrate;

forming a polycrystalline silicon layer of the second conductivity type on the fourth thin dielectric layer; and forming an anti-reflective coating (ARC) layer on the polycrystalline silicon layer of the second conductivity type.

10. The method of claim 1, wherein providing the substrate comprises providing an N-type monocrystalline silicon substrate, and wherein the first conductivity type is P-type and the second conductivity type is N-type.

11. The method of claim 1, wherein providing the substrate comprises providing a P-type monocrystalline silicon substrate, and wherein the first conductivity type is N-type and the second conductivity type is P-type.

* * * * *